United States Patent
Ichimura et al.

(10) Patent No.: US 7,550,724 B2
(45) Date of Patent: Jun. 23, 2009

(54) ELECTRON BEAM DEVICE AND ITS CONTROL METHOD

(75) Inventors: Takashi Ichimura, Hitachinaka (JP); Takeshi Ogashiwa, Hitachinaka (JP); Toshihide Agemura, Hitachinaka (JP); Kenji Aoki, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 471 days.

(21) Appl. No.: 11/520,605

(22) Filed: Sep. 14, 2006

(65) Prior Publication Data

US 2007/0057185 A1    Mar. 15, 2007

(30) Foreign Application Priority Data

Sep. 14, 2005    (JP) .............................. 2005-266931

(51) Int. Cl.
*G01N 23/00* (2006.01)
(52) U.S. Cl. .................... 250/310; 250/306; 250/307
(58) Field of Classification Search ....... 250/306–443.1
See application file for complete search history.

(56) References Cited

U.S. PATENT DOCUMENTS

| | | | | |
|---|---|---|---|---|
| 4,020,353 A | * | 4/1977 | Saito et al. ............. | 250/441.11 |
| 5,029,249 A | * | 7/1991 | Ohtaka ..................... | 250/306 |
| 5,214,290 A | * | 5/1993 | Sakai ....................... | 250/492.2 |
| 5,324,950 A | * | 6/1994 | Otaka et al. ............. | 250/441.11 |
| 7,109,483 B2 | * | 9/2006 | Nakasuji et al. .............. | 250/310 |
| 7,157,703 B2 | * | 1/2007 | Nakasuji et al. .............. | 250/311 |
| 7,244,932 B2 | * | 7/2007 | Nakasuji et al. .............. | 250/306 |
| 2002/0130262 A1 | * | 9/2002 | Nakasuji et al. .............. | 250/311 |
| 2002/0148961 A1 | * | 10/2002 | Nakasuji et al. .............. | 250/311 |
| 2007/0085003 A1 | * | 4/2007 | Miyazaki et al. ............. | 250/310 |

FOREIGN PATENT DOCUMENTS

| | | |
|---|---|---|
| JP | 11-233053 | 8/1999 |
| JP | 2000-200574 | 7/2000 |
| JP | 2004-095459 | 3/2004 |

* cited by examiner

*Primary Examiner*—David A Vanore
*Assistant Examiner*—Andrew Smyth
(74) *Attorney, Agent, or Firm*—McDermott Will & Emery LLP (57) ABSTRACT

An electron beam device includes an electron gun section having an internal space kept at an ultrahigh vacuum level for generating a primary electron beam, a mirror section having an internal space kept at a vacuum level lower than that of the electron gun section for scanning a specimen with an electron probe of the primary electron beam generated in the electron gun section and focused on the specimen, a differential exhaust diaphragm for providing communication in internal space between the electron gun section and the mirror section and passing the primary electron beam, and a control section for controlling respective constituent elements in the electron beam device. A diaphragm mechanism having a plurality of different diaphragm aperture diameters is provided between a second anode and a first condenser lens.

8 Claims, 7 Drawing Sheets

ELECTRON BEAM DEVICE AND ITS CONTROL METHOD

BACKGROUND OF THE INVENTION

The present invention relates to electron beam devices and more particularly, to an electron beam device which can suppress the contamination of a differential exhaust diaphragm regardless of the value of a probe current.

In an electron beam device represented by a typical scanning electron microscope, various sorts of observation condition parameters are set according to a specimen or observation conditions, and a user observes the enlarged image of the specimen. The observation condition parameters include, for example, acceleration voltage, the emission current of an electron gun, condenser lens conditions, working distance (a distance between an objective lens and a specimen), conditions of a system for detecting a signal for specimen observation, and objective diaphragm aperture diameter.

Other electron beam devices are used to analyze a very small region on a specimen by combining with various types of analysis devices. The analyzing method includes, for example, an energy-dispersive X-ray (EDX) spectroscopy, wavelength-dispersive X-ray (WDX) spectroscopy, and an electron backscatter diffraction pattern (EBSP) method.

In the EDX spectroscopy, spectroscopy is carried out by directly detecting a characteristic X ray generated from a specimen with use of a semiconductor detector and by converting the detected X ray to an electric signal. A pulse current is generated in proportion to the energy of the detected characteristic X ray, and the pulse current is sorted and measured by a multichannel crest analyzer.

In the WDX spectroscopy, spectroscopy is carried out by separating and detecting an X ray having a specific wavelength based on Brag reflection at spectroscopic crystal. The wavelength of the characteristic X ray is measured from the diffraction angle of the X ray Brag-reflected by the spectroscopic crystal to identify the type of an element.

In the EBSP method, since a Kikuchi pattern created by inelastic backscatter electrons from a specimen varies with the orientation of the specimen, the pattern is analyzed by scanning a specimen with use of an incident electron probe to obtain an image distributed in the crystalline orientation of the polycrystalline specimen.

When these analysis methods are employed, it is necessary to make the value of a current of an electron beam to be irradiated on the specimen larger than that merely when the enlarge image of the specimen is obtained. For example, a probe current Ip for high resolution observation may be set to have a value of several pA to tens of pA. However, the probe current is required to have a value of hundreds of pA in the EDX spectroscopy, whereas, the probe current is required to have a value of about tens of nA in the WDX spectroscopy.

It is generally considered that the more the charge of an irradiated electron beam increases or the lower the vacuum level of a site of a specimen having the electron beam irradiated thereon is (or the higher a remaining internal pressure is), the higher the contamination level of an element such as each diaphragm in an electron beam device is. In other words, the interior of the device when analyzing a specimen becomes more contaminated than when the device observes the enlarged image of the specimen.

In the electron beam device, in general, the interior of a mirror section having a specimen mounted therein is kept at a high vacuum level, and the interior of an electron gun section including a cathode for emitting an electron is kept at a vacuum level lower than that of the mirror section. In order to pass an electron beam through the device, the interior of the electron gun section communicates with the interior of the mirror section via a small aperture known as a differential exhaust diaphragm.

Accordingly, the aperture diameter of the differential exhaust diaphragm is set to have preferably a minimum value from the viewpoints of having no influences on an optical system and suppressing movement of a substance such as a gas between the electron gun section and the mirror section. In other words, the contamination of the differential exhaust diaphragm can lead to a cause of immediately reducing the optical performance of the electron beam device.

In order to avoid the above problem, there is proposed a prior art variable diaphragm device for an electron microscope or the like, wherein a long diaphragm plate is previously wound around one shaft, winding of the diaphragm plate by rotating the other shaft causes one of diaphragm holes made in the surface of the diaphragm plate to traverse an opening or aperture made in a case, so that, even when one diaphragm aperture is contaminated, another diaphragm plate aperture can be replaced therewith (refer to JP-A-11-233053, paragraphs 0012-0014, FIG. 2).

Also proposed is a charged particle beam device which, when the total amount of charges of a primary electron beam hit on a diaphragm plate exceeds a predetermined reference value, determines that the contamination of a diaphragm aperture exceeded such an allowable limit value as not to have influences on an image quality, and the current diaphragm aperture is replaced with new one by means of an actuator (refer to JP-A-2004-95459, paragraph 0021, FIG. 2).

Further proposed is a scanning electron microscope which comprises a diaphragm plate having a diaphragm aperture and a thick plate having an aperture section and laminated on the diaphragm plate, and in which a voltage applying means applies a high voltage to the diaphragm plate for flashing to remove a contaminant deposited on the diaphragm plate (refer to JP-A-2000-200574, paragraph 0019, FIG. 1).

However, the above prior art variable diaphragm device (see JP-A-11-233053) for an electron microscope or the like has a problem that, since the diaphragm plate is slid against the case, a gas or the like tends to leak at the sliding part and thus the device is not suitable as a differential exhaust diaphragm.

The above prior art charged particle beam device (JP-A-2004-95459) has a mechanism for switching between diaphragm holes with use of the actuator. However, the device also has a problem that, since a leakage of a gas or the like tends to take place in the switching part of the mechanism and the differential exhaust diaphragm has a complex structure, it is difficult to employ the mechanism in the differential exhaust diaphragm.

In the scanning electron microscope (JP-A-2000-200574) of the above prior art, in order to effectively prevent the contamination of the diaphragm plate, the thick plate is required to have a large thickness; whereas, in order to apply the high voltage for flashing, the periphery of the diaphragm plate is required to have a high insulation structure. Accordingly, the prior art microscope is disadvantageous in that it is difficult to employ such a structure for the differential exhaust diaphragm at which a high vacuum atmosphere comes into contact with a ultra high vacuum atmosphere and which is required to keep an optically accurate positional relationship.

Any of the aforementioned prior arts is basically arranged, only after the diaphragm aperture is contaminated, so as to take ex-post-facto counter-measures against it. In particular, when the probe current is large, the contamination of the differential exhaust diaphragm is disadvantageously increased. For the purpose of solving the above problem, from the viewpoint of avoiding reduction in vacuum level or fluctuations in optical performance caused by provision of an excessive margin to the aperture diameter of the diaphragm hole, simplifying the structure, and facilitating the operation, maintenance and management; there has been demanded a technique not for performing exchange or contamination removal each time that the differential exhaust diaphragm is contaminated but for suppressing the deposition itself of a contaminant deposited on the diaphragm.

SUMMARY OF THE INVENTION

It is therefore an object of the present invention to provide an electron beam device, in view of the problems in the prior arts, can suppress contamination of a differential exhaust diaphragm regardless of the magnitude of a probe current.

The above object is attained by providing an electron beam device which includes an electron gun having an electron source for generating a primary electron beam, a differential exhaust diaphragm for providing communication between an electron gun section having the electron gun accommodated therein and a mirror section having a specimen accommodated therein, and a condenser lens for temporarily converging the primary electron beam on an aperture of the differential exhaust diaphragm or in the vicinity thereof. The electron beam device further includes a diaphragm mechanism disposed in an optical path from the electron source to the condenser lens for switching between diameters of the aperture, and a changeover mechanism for switching between the aperture diameters of the diaphragm mechanism according to a position of a crossover point to which the primary electron beam is temporarily converged by the condenser lens.

The above object is also attained by providing a method for controlling an electron beam device which includes an electron gun having an electron source for generating a primary electron beam, a differential exhaust diaphragm for providing communication between an electron gun section having said electron gun accommodated therein and a mirror section having a specimen accommodated therein, and a condenser lens for temporarily converging the primary electron beam on an aperture of the differential exhaust diaphragm or in the vicinity thereof. The electron beam device further includes a diaphragm mechanism disposed in an optical path from the electron source to the condenser lens for switching between diameters of the aperture. The method is structured for switching between the aperture diameters of the diaphragm mechanism according to a position of a crossover point to which the primary electron beam is temporarily converged by the condenser lens.

According to the electron beam device and its control method of the present invention, since the diaphragm mechanism for switching between the aperture diameters is disposed between the electron source and the condenser lens, and switching between the aperture diameters is carried out according to the position of the crossover point; the contamination of the differential exhaust diaphragm can be suppressed regardless of the value of the probe current.

Other objects, features and advantages of the invention will become apparent from the following description of the embodiments of the invention taken in conjunction with the accompanying drawings.

DETAILED DESCRIPTION OF THE EMBODIMENTS

An embodiment of the present invention will be explained in detail with reference to the accompanying drawings.

By first referring to FIGS. 1A to 1C, explanation will be made as to a problem generated when the probe current $I_P$ is varied in an electron beam device 105 as a comparative example.

The electron beam device 105 includes a mirror section 32 having an internal space kept at a high vacuum level, an electron gun section 31 having an internal space of an internal pressure kept at an ultrahigh vacuum level lower than that of the mirror section 32, and a differential exhaust diaphragm 33 for providing communication between the internal space of the mirror section 32 and the internal space of the electron gun section 31.

The electron gun section 31 includes an electron source 51, a diaphragm 53 disposed directly below the electron source 51, and a condenser lens 55 for converging a primary electron beam 3 emitted from the electron source 51. The mirror section 32 includes an objective diaphragm 7 for limiting the amount of a probe current.

In the electron beam device 105, the primary electron beam 3 as a flux emitted from the electron source 51 is passed through the diaphragm 53 under the electron source 51, temporarily converted by the condenser lens 55, and again spread. The spread primary electron beam 3 is limited by the objective diaphragm 7 to be partly blocked. As a result, the current value (≈probe current $I_P$) of the primary electron beam 3 after passed through the objective diaphragm 7 is limited.

The location to which the primary electron beam 3 is temporarily converted by the condenser lens 55, that is, a crossover point 56 can be moved forwardly or backwardly along an optical axis direction by adjusting the amount of a current passed through a magnetic field coil (not shown) of the condenser lens 55.

Figure 1A:
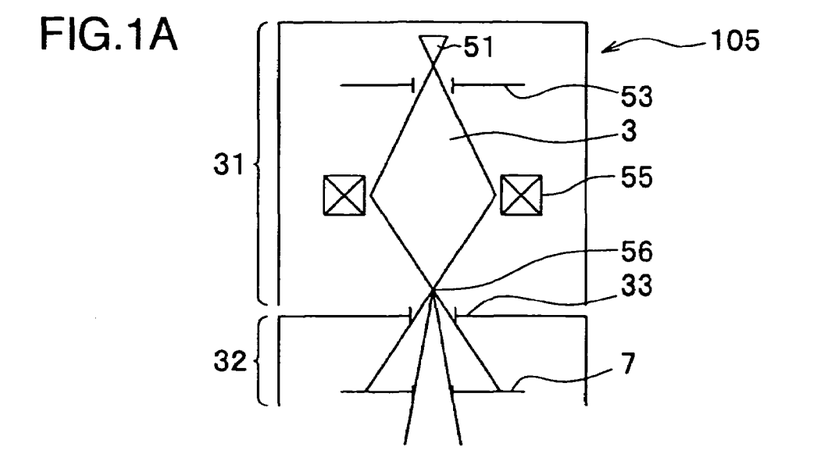
FIGS. 1A, 1B, and 1C show diagrams for explaining a problem in an electron beam device of a comparative example when a probe current is varied.
Figure 1B:
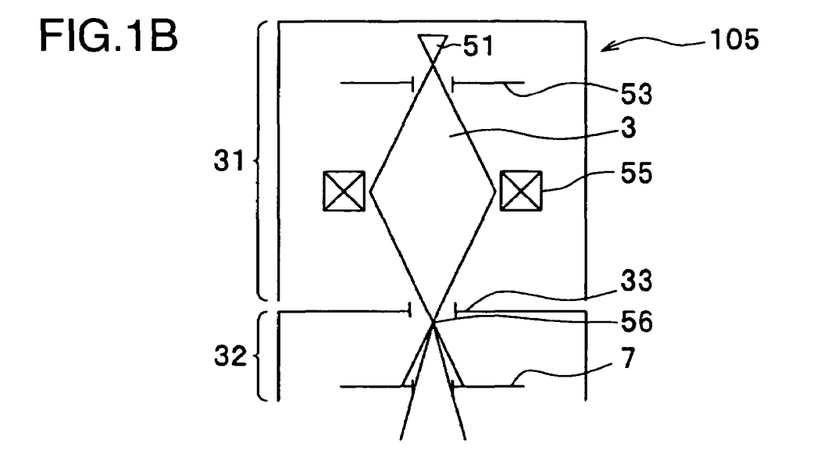

Thus, as shown in FIG. 1A, as the crossover point 56 is located away from the objective diaphragm 7 (or its aperture surface, which will be expressed in the same manner in this paragraph, hereinafter), the probe current $I_P$ becomes smaller. As shown in FIG. 1B, as the crossover point 56 is moved closer to the objective diaphragm 7 from the position of FIG. 1A, the probe current $I_P$ becomes larger. Therefore, when the crossover point 56 is located at the same plane as the objective diaphragm 7, the probe current $I_P$ becomes nearly equal to the current value of the primary electron beam 3 passed through the diaphragm 53. In this way, the probe current $I_P$ can be adjusted by controlling the condenser lens 55 to move the crossover point 56 forwardly or backwardly.

The scanning electron microscope as one type of the electron beam device 105 has an arrangement of being capable of selecting an exclusive mode known as "observation mode" or "analysis move". In the scanning electron microscope, the probe current $I_P$ is set at a suitable value by controlling the condenser lens 55 according to the selected mode. Since setting of, e.g., the "observation mode" causes the drive current of the condenser lens 55 to become large, the crossover point 56 is moved away from the objective diaphragm 7 and the probe current $I_P$ for specimen observation becomes small. Since setting of the "analysis mode" causes the current of the condenser lens 55 to become small, the crossover point 56 is moved close to the objective diaphragm 7 and the probe current $I_P$ becomes large for specimen analysis.

Figure 1C:
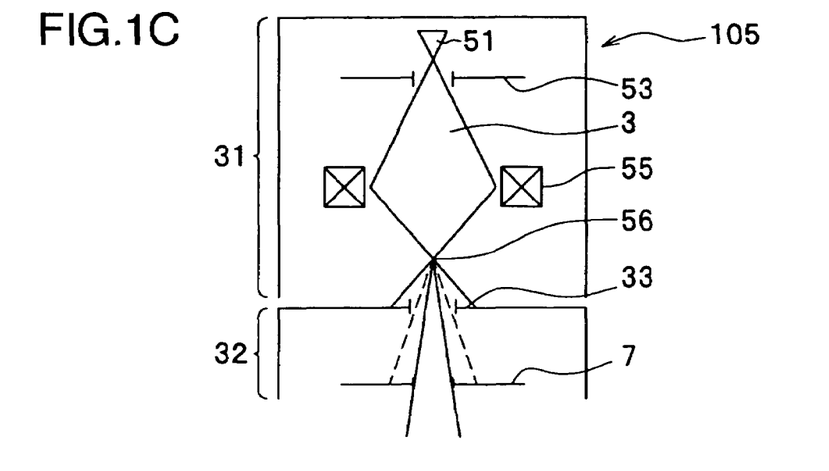

As shown in FIG. 1C, when the crossover point 56 is moved further away from the objective diaphragm 7, the primary electron beam 3 spreads on the differential exhaust diaphragm 33 beyond the aperture diameter of the diaphragm, that is, part of the primary electron beam 3 reaches the differential exhaust diaphragm 33 itself. When subjected to irradiation of the primary electron beam 3, the differential exhaust diaphragm 33 is contaminated. When the aperture of the differential exhaust diaphragm 33 is contaminated, the aperture diameter of the diaphragm becomes small. This results in troubles such as a reduced probe current $I_P$ or a distorted shape of the aperture, thus generating an abnormal astigmatism. This results in a deterioration in the performance of the electron beam device 105.

Since the diaphragm 53 under the electron source 51, even when subjected to irradiation of the primary electron beam 3, is put in the ultrahigh vacuum atmosphere, the diaphragm is less contaminated. The objective diaphragm 7, when subjected to irradiation of the primary electron beam 3, is contaminated. However, the objective diaphragm can be replaced relatively easily, and the contamination can also be removed by providing a heating mechanism.

However, since the differential exhaust diaphragm 33 comes into contact with the internal space of the mirror section 32 having a vacuum-level lower than that of the electron gun section 31 (that is, having a larger residual pressure), the differential exhaust diaphragm 33 tends to be contaminated when subjected to irradiation of the primary electron beam 3. Since the exchange of the differential exhaust diaphragm 33 is carried out by temporarily removing the entire electron gun section 31 from the mirror section 32, this involves troublesome and difficult works. Further, since the diaphragm is located at the interface between the electron gun section 31 and the mirror section 32, it is difficult to provide a heating mechanism thereto for contaminant removal. For this reason, it is disadvantageously difficult to keep the differential exhaust diaphragm 33 clean.

In the electron beam device 105, the current $I_P$ of the electron probe for specimen scanning is required to be set at a suitable value depending on its application purpose such as observation or analysis. Further, it is necessary to set the value of the probe current in such a manner as to suppress the contamination of the differential exhaust diaphragm 33 and not to avoid deterioration of the performance of the electron beam device 105 regardless of the magnitude of the probe current $I_P$.

From the above consideration, the inventor of the present application has paid attention to the fact that, in order to keep the differential exhaust diaphragm 33 clean, it is only required that the differential exhaust diaphragm 33 not be subjected to irradiation of the primary electron beam 3. For the purpose of preventing the differential exhaust diaphragm 33 from not being subjected to irradiation of the primary electron beam 3 and simultaneously allowing change of the probe current $I_P$, the following methods are considered as an example.

(1) A position control range of the crossover point 56 is limited to such a range that the primary electron beam 3 does not reach the plate surface of the differential exhaust diaphragm 33.

(2) the diaphragm 53 under the electron source 51 having a small aperture diameter is used to make small the spread of the primary electron beam 3 at the position of the differential exhaust diaphragm 33.

(3) The aperture diameter of the differential exhaust diaphragm 33 is made large so that even the spread of the primary electron beam 3 causes the beam not to hit the differential exhaust diaphragm 33.

The above method (1) has a problem, for example, that, since the dynamic range of the probe current $I_P$ is highly limited, a desired observation or analysis method cannot be employed. The above method (2) has a problem that the maximum value of the probe current $I_P$ is limited to a small value. The above method (3) has a problem that a substance such as a gas is much leaked from the mirror section 32 to the electron gun section 31.

Figure 2:
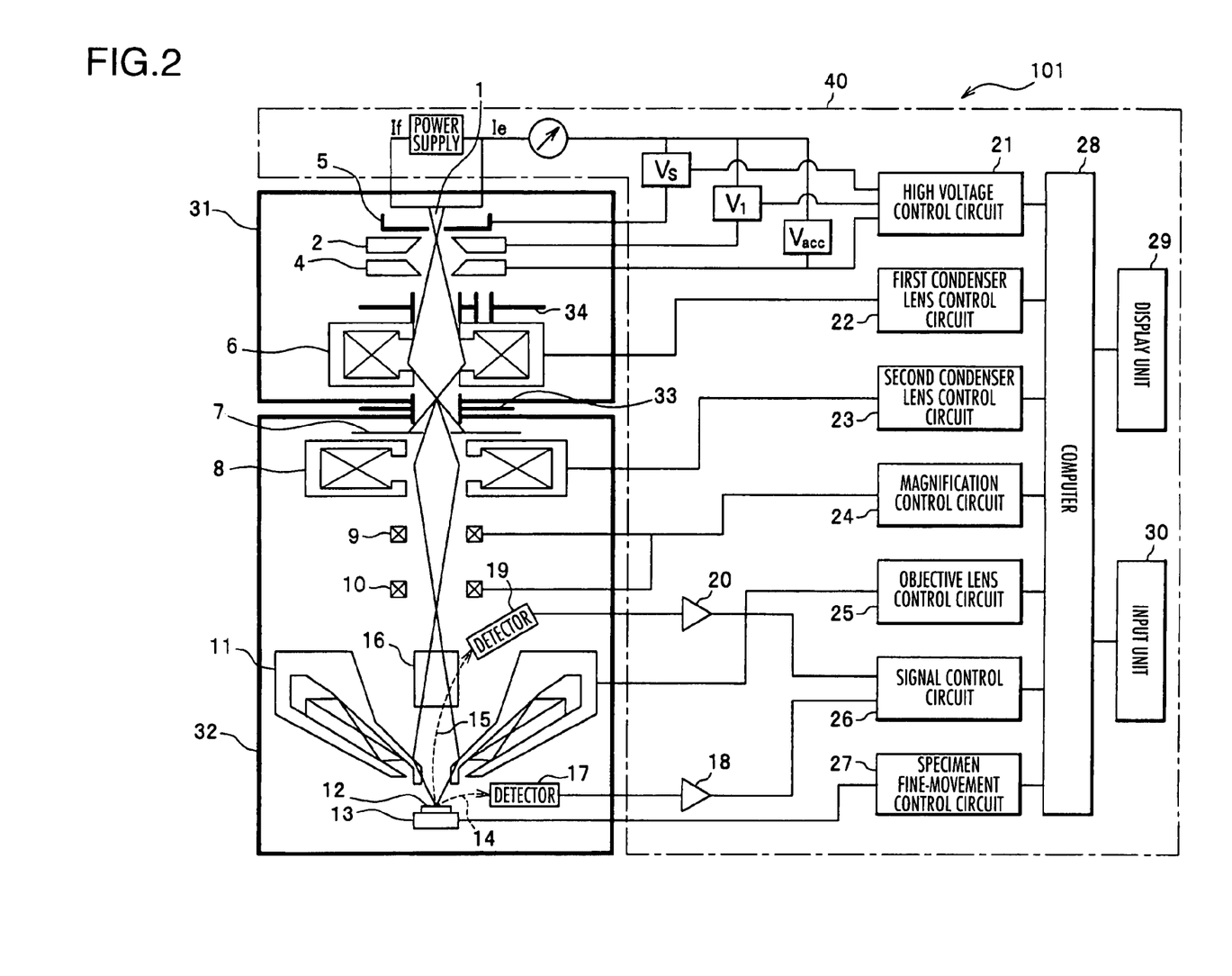
FIG. 2 is a block diagram of an arrangement of an electron beam device in accordance with a first embodiment of the present invention.

FIG. 2 is a block diagram of an arrangement of an electron beam device 101 in accordance with a first embodiment of the present invention. Explanation will be made in connection with a case where the electron beam device 101 is a scanning electron microscope having a Schottky emission electron gun mounted therein. However, other types of the electron beam device and the electron gun may be employed. For example, the electron beam device may be a transmission electron microscope (TEM), a scanning electron microscope (SEM), or a scanning transmission electron microscope (STEM).

The electron gun may be, for example, a Schottky-type electron gun, a field-emission electron gun (FEG), a thermal (thermally assisted) field-emission electron gun, a thermionic-emission electron gun, or a cold (cathode) field-emission electron gun.

The electron beam device 101 includes an electron gun section 31 having an internal space kept at an ultrahigh vacuum level for generating a primary electron beam 3, a mirror section 32 having an internal space kept at a vacuum level lower than that of the electron gun section 31 for scanning a specimen 12 with use of an electron probe for focusing the primary electron beam 3 generated by the electron gun section 31 onto the specimen 12, a differential exhaust diaphragm 33 for providing communication in internal space between the electron gun section 31 and the mirror section 32 and passing the primary electron beam 3 therethrough, and a control section 40 for controlling the sections and elements in the electron beam device 101.

In the electron beam device 101, an extraction voltage $V_1$ applied between a cathode 1 and a first anode 2 causes emission of the primary electron beam 3, the beam is further accelerated by an acceleration voltage Vacc applied to a second anode 4, and advanced into an electromagnetic lens system at a latter stage. In this case, a suppresser electrode 5 is used to suppress unnecessary thermions emitted from a filament held to the cathode 1 by passing a heating current If through the filament, and a negative suppresser voltage Vs is applied to the suppresser electrode 5. A high voltage control circuit 21 has a function of generating the acceleration voltage Vacc, the drawer voltage $V_1$, and the suppresser voltage Vs under control of a computer 28.

The first condenser lens 6 once converges the primary electron beam 3 under control of a first condenser lens control circuit 22. The primary electron beam 3 after converged is again diverged. The objective diaphragm 7 limits the illumination angle of the primary electron beam 3. A second condenser lens 8 again converges the diverged primary electron beam 3 under control of a second condenser lens control circuit 23. An objective lens 11 converges the primary electron beam 3 to be thinner under control of an objective lens control circuit 25 to form an electron probe. Further, an upper-stage deflecting coil 9 and a lower-stage deflecting coil 10 forming a two-stage deflecting coils deflect the electron probe to scan the specimen 12 under control of a magnification control circuit 24.

In this case, the specimen 12 is mounted on a specimen finely-moving unit 13, which in turn is controlled by a specimen fine-movement control circuit 27. Among signals generated from the illumination point of the primary electron beam 3 of the specimen 12, a reflected electron signal 14 having a high energy emitted at a relatively shallow angle is detected by a detector 17 and amplified by an amplifier 18. A secondary electron signal 15 having a low energy is drawn up by the magnetic field of the objective lens 11, detected by a detector 19 without causing the axis shift of the primary electron beam 3 by an orthogonal electric and magnetic field (EXB) unit 16 located above the objective lens 11, and then amplified by an amplifier 20. Output signals (detection signals) of the amplifiers 18 and 20 are input to a signal control circuit 26.

The computer 28 controls the high voltage control circuit 21, the first condenser lens control circuit 22, the second condenser lens control circuit 23, the magnification control circuit 24, the objective lens control circuit 25, the signal control circuit 26, and the specimen fine-movement control circuit 27. The computer also processes the amplified secondary and reflected electron signals and displays it on the display screen of a display unit 29 as a magnified or enlarged image of the specimen 12.

The mode such as the "observation mode" or "analysis mode" can be selected or set by an input unit 30 of the computer 28. This causes a current of the first condenser lens 6 for the selected mode to be set by the first condenser lens control circuit 22 under control of the computer 28. As a result, the crossover point is controlled and the probe current $I_P$ is set at its target value.

As has been explained above, the differential exhaust diaphragm 33 is disposed between the electron gun section 31 and the mirror section 32. Further, a diaphragm mechanism 34 having a plurality of different aperture diameters (of, e.g., 0.5 mm and 0.1 mm) is provided between the second anode 4 and the first condenser lens 6, so that diaphragm determines the maximum value of the probe current $I_P$ of the primary electron beam 3 proceeding in the first condenser lens direction.

Figure 3:
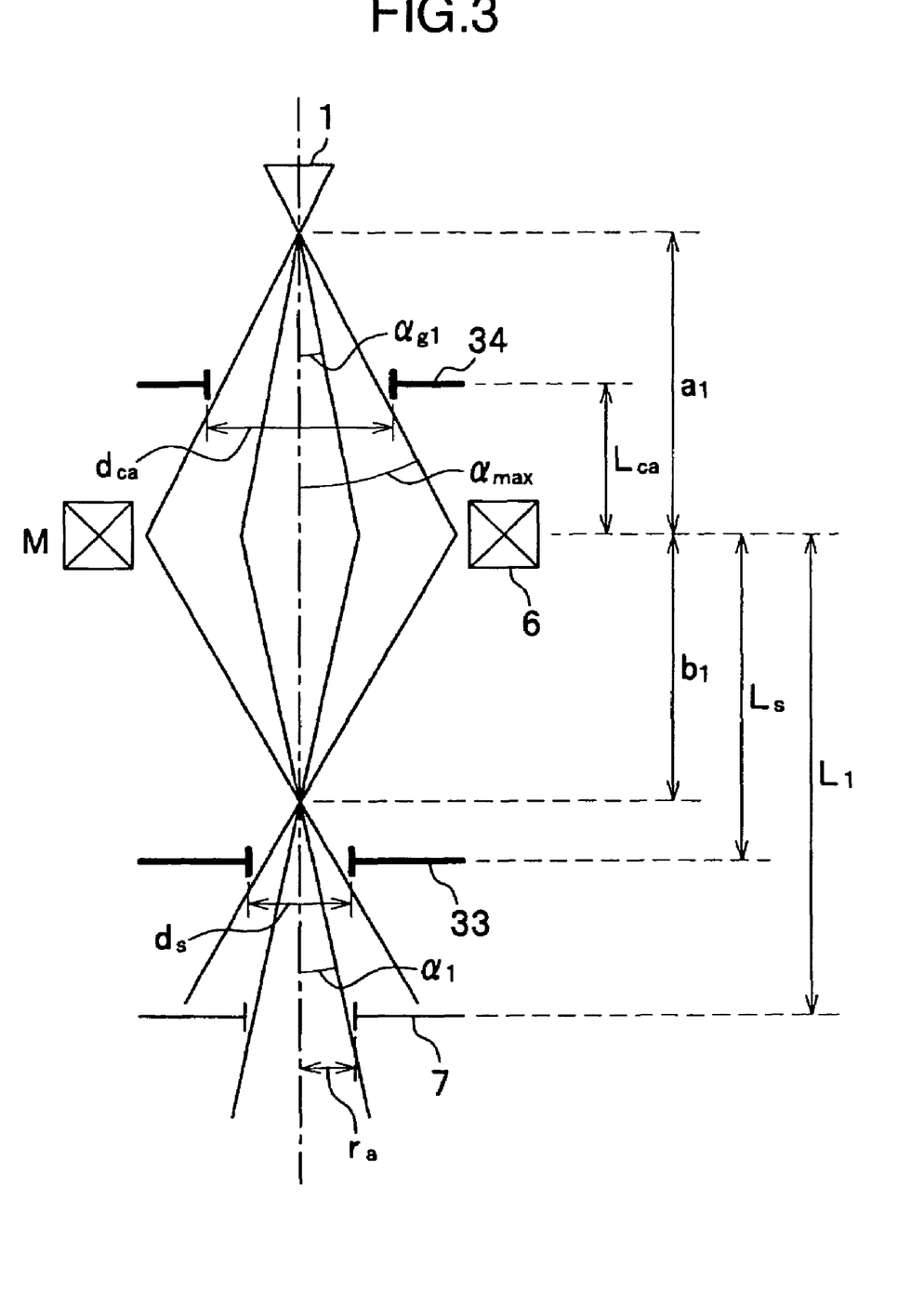
FIG. 3 is a diagram for explaining a partial optical path showing a relationship between a crossover position $b_1$ and a probe current $I_P$.

FIG. 3 is a diagram for explaining a partial spectral path showing a relationship between the crossover position $b_1$ and the probe current $I_P$.

Assume now that a distance from the main point of the first condenser lens 6 to the crossover point is denoted by the crossover position $b_1$, a probe current is denoted by $I_P$, and the beam on the differential exhaust diaphragm 33 has a spread $d_s$.

The probe current $I_P$ passing through the projection diameter is given by an equation (1) which follow, from an angle $\alpha_g$ corresponding to half of an aperture spread angle of the primary electron beam 3 when the aperture of the objective diaphragm 7 is projected on the aperture of the diaphragm mechanism 34 via the first condenser lens 6. In this case, symbol $\alpha_{gmax}$ denotes a beam spread angle $\alpha_{gmax}$ when a maximum probe current $I_{pmax}$ is obtained and which depends on the aperture diameter of the diaphragm mechanism 34. Although explanation is made in connection with a case where the maximum probe current $I_{pmax}$ is 100 nA as a reference, the value of the maximum probe current $I_{pmax}$ may be increased or decreased from this value.

$$I_p = \left(\frac{\alpha_g}{\alpha_{gmax}}\right)^2 \cdot I_{pmax} \quad (1)$$

The beam spread angle $\alpha_{gmax}$ is expressed by an equation (2) which follows, from an aperture diameter $d_{ca}$ of the diaphragm mechanism 34, a distance $L_{ca}$ from the main point of the first condenser lens 6 to the aperture surface of the diaphragm mechanism 34, and a distance $a_1$ from the cathode 1 to the first condenser lens 6.

$$\alpha_{gmax} = \frac{\frac{d_{ca}}{2}}{a_1 - L_{ca}} \quad (2)$$

When the aperture diameter $d_{ca}$ of the diaphragm mechanism 34, the distance $L_{ca}$, and the distance $a_1$ are changed; the maximum probe current $I_{pmax}$ varies. For this reason, when it is assumed to obtain 100 nA as the maximum probe current $I_{pmax}$ of the reference, it is necessary to again compute the maximum probe current $I_{pmax}$ by comparing the aperture diameter $d_{ca}$, the distance $L_{ca}$, and the distance $a_1$ after dimension change. A beam spread angle $\alpha_{g1}$, when the angle $\alpha_g$ is limited by the objective diaphragm 7, is given by an equation (3) which follows. In this equation, symbol $M_1$ denotes a reduction factor $M_1$ of the first condenser lens 6, $r_a$ denotes an aperture diameter of the objective diaphragm 7, and $L_1$ denotes a distance between the first condenser lens 6 and the objective diaphragm 7.

$$\alpha_{g1} = M_1 \cdot \alpha_1 = \frac{b_1}{a_1} \cdot \alpha_1 = \frac{b_1}{a_1} \cdot \frac{r_a}{|L_1 - b_1|} \quad (3)$$

The angle $\alpha_g$ is obtained by comparing the beam spread angle $\alpha_{gmax}$ not limited by the objective diaphragm 7 and the beam spread angle $\alpha_{g1}$ limited by the objective diaphragm 7 under the respective conditions of the crossover position $b_1$ and by selecting smaller one thereof. That is, when min (X,Y) is an operator for selecting smaller one of X and Y, an effective angle $\alpha_g$ is given as follows.

$$\alpha_g = \min(\alpha_{gmax}, \alpha_{g1}) \quad (4)$$

A relation between the crossover position $b_1$ and the probe current $I_P$ is found in accordance with the equation (1) using the angle $\alpha_g$.

In this case, the display screen on the differential exhaust diaphragm 33 is given by an equation (5) which follows, from a distance $L_s$ between the first condenser lens 6 and the primary electron beam 3.

$$d_s = 2 \times |L_s - b_1| \cdot \tan\left(\frac{a_1}{b_1} \cdot \alpha_{gmax}\right) \qquad (5)$$

Figure 4A:
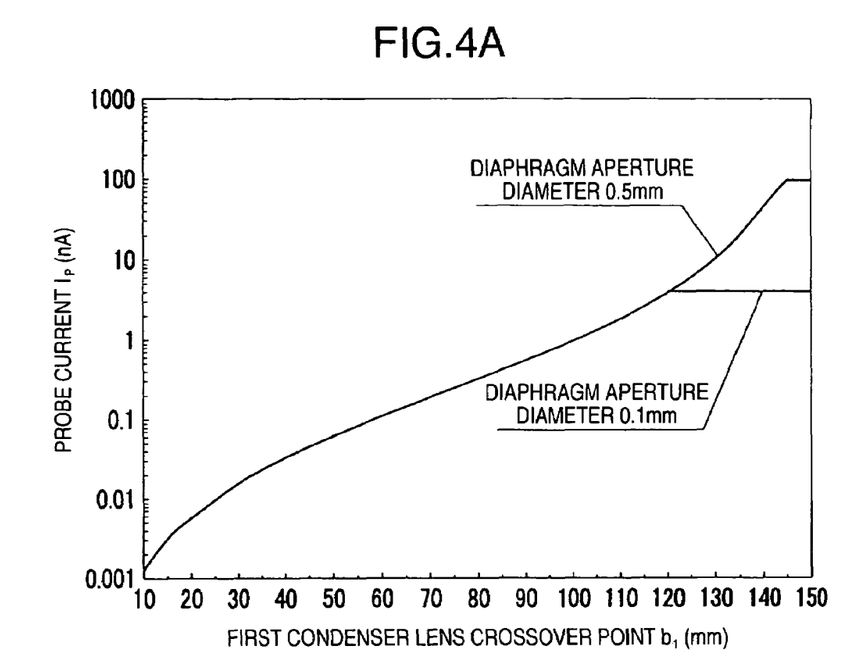
FIG. 4A is a graph showing a change in the probe current $I_P$ to the crossover position $b_1$ of a first condenser lens 6.
Figure 4B:
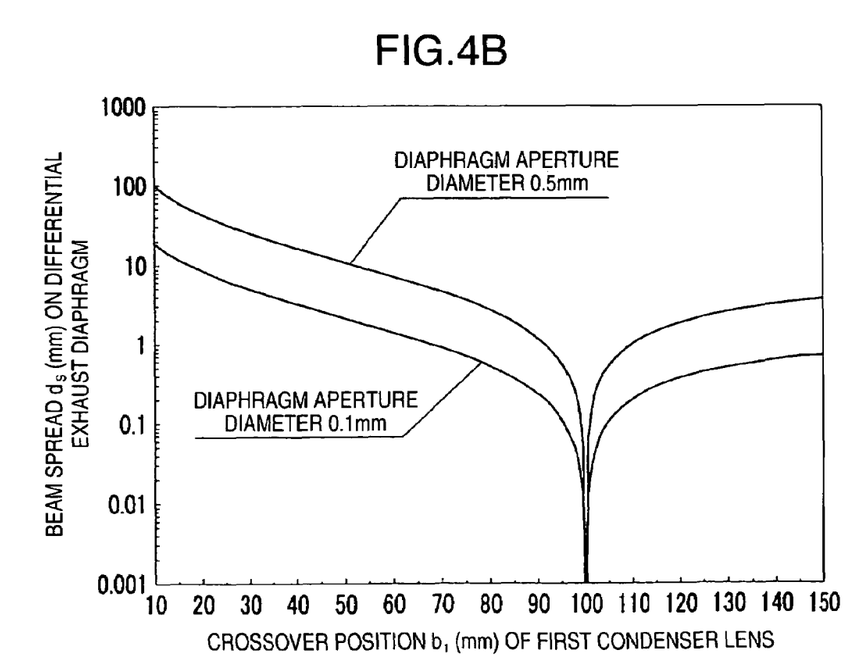
FIG. 4B is graph showing a spread change in a beam on an aperture of a differential exhaust diaphragm 33 to the crossover position $b_1$.

FIG. 4A is a graph showing a change of the probe current $I_P$ to the crossover position $b_1$ of the first condenser lens 6, and FIG. 4B is a graph showing a change in the beam spread on the aperture of the differential exhaust diaphragm 33 to the crossover position $b_1$.

The diaphragm mechanism 34 has an diaphragm having aperture diameters of 0.5 mm and 0.1 mm. Other conditions are as follows.

| | |
|---|---|
| $I_{pmax}$ | 100 nA |
| $a_1$ | 40 mm |
| $b_1$ | 10-150 mm |
| $r_a$ | 0.025 mm |
| $L_1$ | 150 mm |
| $d_{ca}$ | 0.5 mm |
| $L_{ca}$ | 20 mm |
| Ls | 100 mm |

As shown in FIG. 4A, when the probe current $I_P$ is varied from 0.001 nA (1 pA) to 100 nA with the aperture diameter of the differential exhaust diaphragm 33 of 0.5 mm, the probe current can be obtained by changing the crossover position $b_1$ from 10 mm to 145 mm. When the aperture diameter of the differential exhaust diaphragm 33 is 0.1 mm, however, the probe current becomes 4 nA with the crossover position $b_1$ of 120 mm, and the probe current $I_P$ higher than 4 nA cannot be obtained.

When the aperture diameter of the differential exhaust diaphragm 33 is 0.5 mm, in order to avoid the beam from hitting on the differential exhaust diaphragm 33 itself, it is required to set the beam spread $d_s$ at a value of 0.5 mm or less. In this case, the crossover position $b_1$ is required from FIG. 4B to be 70 mm or larger in the case of the aperture diameter of the diaphragm mechanism 34 of 0.5 mm. In the case of the aperture diameter of the diaphragm mechanism 34 of 0.1 mm, the crossover position $b_1$ is required to be 30 mm or larger.

Accordingly, when it is desired to obtain a small probe current $I_P$ in the aforementioned "observation mode", the crossover position $b_1$ is set at a value in a range of 30 mm-120 mm, and the aperture diameter of the diaphragm mechanism 34 is set at 0.1 mm. When it is desired to obtain a large probe current $I_P$ in the "analysis mode", the crossover position $b_1$ is set at a value in a range of 70 mm-145 mm, and the aperture diameter of the diaphragm mechanism 34 of 0.5 mm is selected. In this case, the probe current $I_P$ having a broad range of dynamic range of 20 pA to 100 nA can be obtained while avoiding the irradiation of the beam on the differential exhaust diaphragm 33 and the contamination thereof. Explanation has been made in connection with the two probe current setting modes, but the number of the probe current setting modes may be 3 or more.

Figure 5:
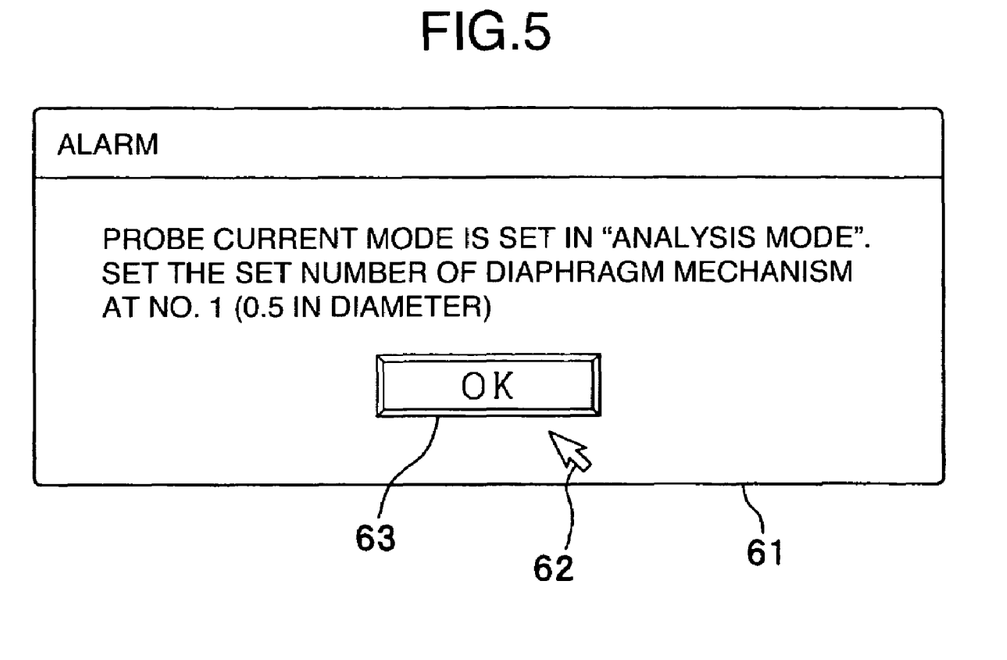
FIG. 5 is a display screen showing an example of an alarm representation displayed on a display device.

FIG. 5 is a display screen showing an example of an alarm display appearing on the display unit 29.

The electron beam device 101 may be arranged so that, when an operator selects a mode such as the "observation mode" or the "analysis mode" by operating the input unit 30, such an alarm window (dialog box) 61 as shown in FIG. 5 is displayed on the display unit 29 under control of the computer 28 to prompt the operator to select a suitable diaphragm aperture diameter in the diaphragm mechanism 34.

In this case, after the operator confirms that the aperture diameter of the diaphragm mechanism 34 is suitably selected, she or he operates the input unit 30 (including a pointing device), moves a pointer 62, and clicks a confirmation button 63 on the display screen of the display unit 29. This causes the computer 28 to execute the next processing operation as soon as the confirmation button 63 is clicked. For this reason, the operator will not forget to change the setting of the diaphragm mechanism 34, and the suitable aperture diameter of the diaphragm in the diaphragm mechanism 34 can be reliably selected according to the selected mode.

Figure 6:
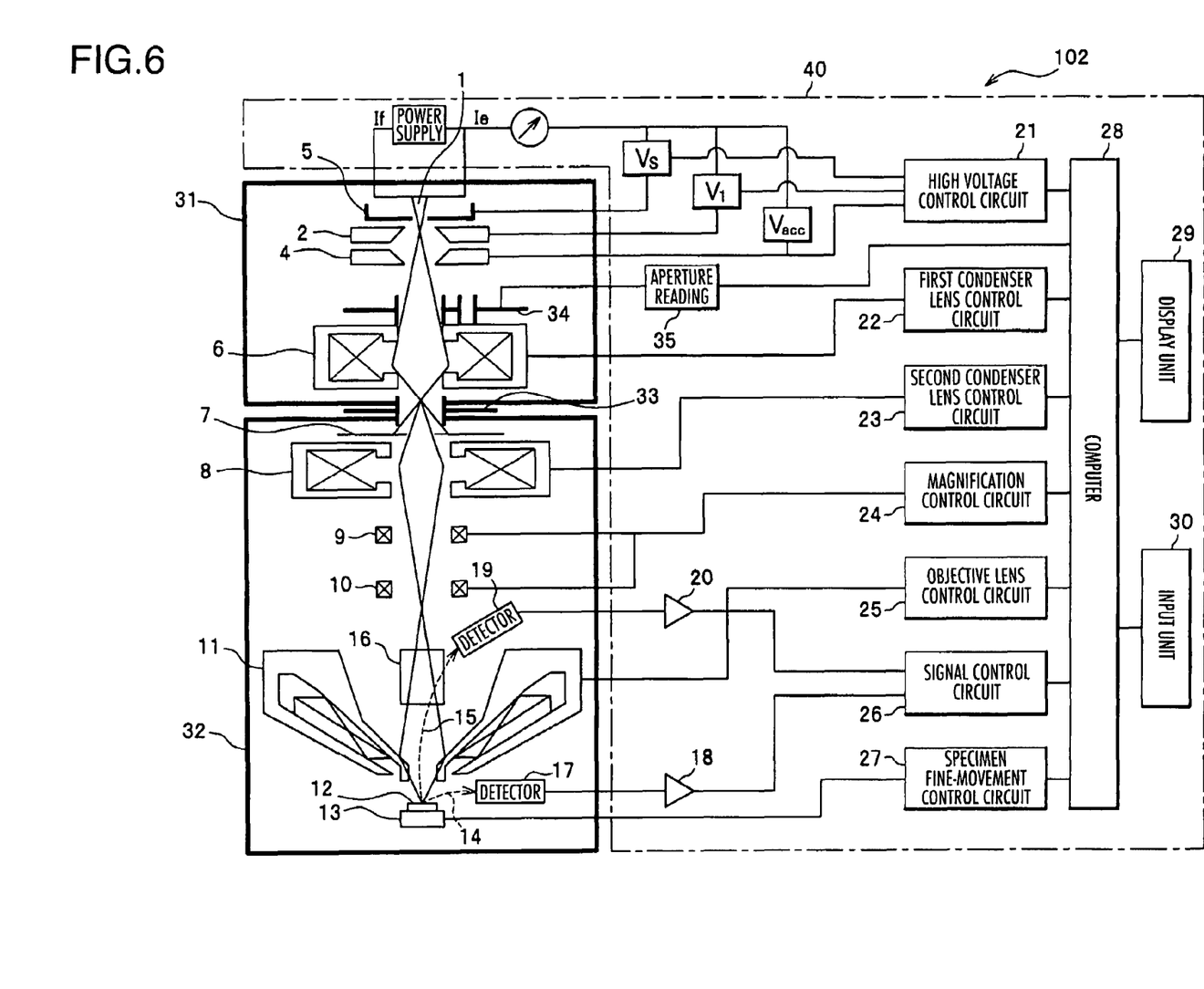
FIG. 6 is a block diagram of an arrangement of an electron beam device in accordance with a second embodiment of the present invention.

FIG. 6 is a block diagram of an arrangement of an electron beam device 102 in accordance with a second embodiment of the present invention.

The electron beam device 102 may have an arrangement similar to that of the electron beam device 101 of the first embodiment, except that the device 102 includes an aperture diameter reading mechanism 35 provided to the diaphragm mechanism 34. The aperture diameter reading mechanism 35 has a function of reading a diaphragm aperture diameter selected in the diaphragm mechanism 34 or diaphragm information about a set number for identifying the selected diaphragm or the like. The aperture diameter reading mechanism 35 transmits the read diaphragm information to the computer 28 connected thereto. And the computer 28 selects a suitable probe current set mode according to the diaphragm aperture diameter or the set number set in the diaphragm mechanism 34. In this way, the current of the first condenser lens 6 is set by the first condenser lens control circuit 22 in such a range as to void the contamination of the differential exhaust diaphragm 33.

In the electron beam device 102, even when the operator unintendedly changes the diaphragm of the diaphragm mechanism 34 to a different aperture diameter, the aperture diameter reading mechanism 35 reads the selected diaphragm aperture diameter or the like, and the computer 28 selects a probe current mode according to the read aperture diameter. Therefore, such setting of the probe current mode as to cause the contamination of the differential exhaust diaphragm 33 can be automatically avoided.

Figure 7:
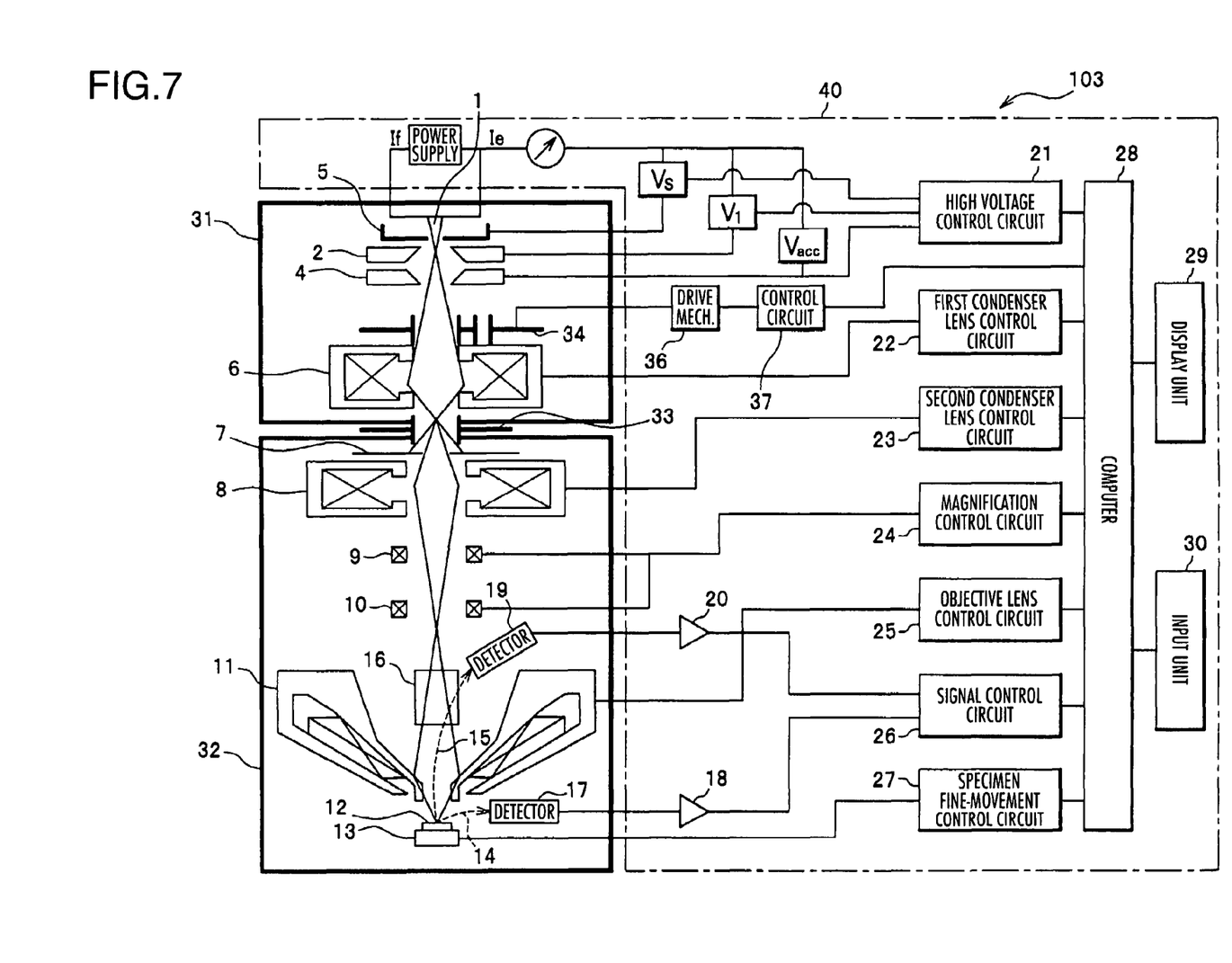
FIG. 7 is a block diagram of an arrangement of an electron beam device in accordance with a third embodiment of the present invention.

FIG. 7 is a block diagram of an arrangement of an electron beam device 103 in accordance with a third embodiment of the present invention.

The electron beam device 103 of the third embodiment may have an arrangement similar to that of the electron beam device 101 of the first embodiment, except that the device 103 includes a drive mechanism 36 mechanically or electrically connected to the diaphragm mechanism 34 and a drive mechanism control circuit 37 connected to the drive mechanism 36 and controlled by the computer 28.

When the operator changes the probe current set mode, this causes the fact of the mode change to be transmitted to the computer 28. And the drive mechanism 36 is actuated under control of the drive mechanism control circuit 37 and the diaphragm aperture diameter is automatically switched, so that the aperture diameter of the diaphragm mechanism 34 is suitably set for a probe current mode after changed.

In the electron beam device 103, even when the probe current mode is changed, such use of the aperture diameter of the diaphragm mechanism 34 as to cause the contamination of the differential exhaust diaphragm 33 can be avoided, and the aperture diameter of the diaphragm mechanism 34 conforming to the probe current mode can be always set.

In this way, in accordance with the electron beam devices 101 to 103 of the aforementioned embodiments, the diaphragm mechanism 34 having a plurality of aperture diameters is provided between the cathode 1 and the first condenser lens 6, and the aperture diameters of the diaphragm mechanism 34 can be selectively used for the convergence position (crossover point) by the first condenser lens 6. Thus, the spread of the primary electron beam 3 on the differential exhaust diaphragm 33 can be suppressed, the contamination of the diaphragm aperture leading to deterioration of the functions of the electron beam devices 101 to 103, and the probe current $I_P$ having a wide range of dynamic range for use in various sorts of observations or analyses.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An electron beam device comprising:
   an electron gun having an electron source for generating a primary electron beam;
   a differential exhaust diaphragm for providing communication between an electron gun section having said electron gun accommodated therein and a mirror section having a specimen accommodated therein; and
   a condenser lens for temporarily converging said primary electron beam on an aperture of said differential exhaust diaphragm or in the vicinity thereof,
   said electron beam device further comprising:
   a diaphragm mechanism disposed in an optical path from said electron source to said condenser lens for switching between aperture diameters; and
   a changeover mechanism for switching between the aperture diameters of said diaphragm mechanism according to a position of a crossover point to which said primary electron beam from said condenser lens is temporarily converged by said condenser lens.

2. An electron beam device according to claim 1, wherein said changeover mechanism, when the position of said crossover point is moved, again switches between said aperture diameters according to the crossover point after moved.

3. An electron beam device according to claim 1, further comprising a crossover position setting circuit for controlling said condenser lens according to said aperture diameter after switched and setting the position of said crossover point.

4. An electron beam device according to claim 2, further comprising a crossover position setting circuit for controlling said condenser lens according to said aperture diameter after switched and setting the position of said crossover point.

5. An electron beam device according to claim 1, further comprising an alarm output device for outputting an alarm to prompt a user to change to suitable one of said aperture diameters according to the position of said crossover position.

6. An electron beam device according to claim 2, further comprising an alarm output device for outputting an alarm to prompt a user to change to suitable one of said aperture diameters according to the position of said crossover position.

7. An electron beam device according to claim 3, further comprising an alarm output device for outputting an alarm to prompt a user to change to suitable one of said aperture diameters according to the position of said crossover position.

8. A method for controlling an electron beam device, said electron beam device comprising:
   an electron gun having an electron source for generating a primary electron beam;
   a differential exhaust diaphragm for providing communication between an electron gun section having said electron gun accommodated therein and a mirror section having a specimen accommodated therein; and
   a condenser lens for temporarily converging said primary electron beam on an aperture of said differential exhaust diaphragm or in the vicinity thereof,
   said electron beam device further comprising a diaphragm mechanism disposed in an optical path from said electron source to the condenser lens for switching between diameters of the aperture,
   said method comprising a step of switching between the aperture diameters of said diaphragm mechanism according to a position of a crossover point to which said primary electron beam is temporarily converged by the condenser lens.

* * * * *